(12) United States Patent
Kitamura et al.

(10) Patent No.: US 12,002,733 B2
(45) Date of Patent: Jun. 4, 2024

(54) HEAT DISSIPATION STRUCTURE, MANUFACTURING METHOD FOR HEAT DISSIPATION STRUCTURE, AND ELECTRONIC APPARATUS

(71) Applicant: Lenovo (Singapore) Pte. Ltd., Singapore (SG)

(72) Inventors: Masahiro Kitamura, Kanagawa (JP); Takuroh Kamimura, Kanagawa (JP); Junki Hashiba, Kanagawa (JP); Takateru Adachi, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/983,561

(22) Filed: Nov. 9, 2022

(65) Prior Publication Data

US 2023/0207419 A1 Jun. 29, 2023

(30) Foreign Application Priority Data

Dec. 27, 2021 (JP) ................. 2021-213311

(51) Int. Cl.
*H01L 23/373* (2006.01)
*H01L 23/00* (2006.01)
(Continued)

(52) U.S. Cl.
CPC ........ *H01L 23/3736* (2013.01); *H01L 23/367* (2013.01); *H01L 23/42* (2013.01); *H05K 1/0203* (2013.01); *H01L 24/29* (2013.01); *H01L 24/32* (2013.01); *H01L 24/83* (2013.01); *H01L 2224/26* (2013.01);
(Continued)

(58) Field of Classification Search
CPC ... H01L 21/4882; H01L 23/34; H01L 23/367; H01L 23/3675; H01L 23/3736; H01L 23/3738; H01L 23/42; H01L 23/427; H01L 24/32; H01L 24/83; H01L 25/16; H01L 2224/26; H01L 2224/26125; H01L 2224/29105; H01L 2224/32245; H01L 2224/83447; H05K 1/0203–0204; H05K 7/20154; H05K 7/2029; H05K 7/2039; H05K 7/20409; G06F 1/203
See application file for complete search history.

(56) References Cited

U.S. PATENT DOCUMENTS 6,108,208 A * 8/2000 Tustaniwskyj ...... H01L 23/3736
428/614
10,643,924 B1 * 5/2020 Shen .................. H01L 25/0655
(Continued)

FOREIGN PATENT DOCUMENTS

JP H03-148199 A 6/1991
JP 2001-325576 A 11/2001
(Continued)

*Primary Examiner* — Amir A Jalali
(74) *Attorney, Agent, or Firm* — Osha Bergman Watanabe & Burton LLP

(57) ABSTRACT

A heat dissipation structure of an electric component that generates heat includes: a heat dissipator provided along a surface of the electric component; a liquid metal interposed between the electric component and the heat dissipator; and a fencing body interposed between the electric component and the heat dissipator in a crushed state and surrounding the liquid metal.

9 Claims, 7 Drawing Sheets

(51) Int. Cl.
    *H01L 23/367*     (2006.01)
    *H01L 23/42*     (2006.01)
    *H05K 1/02*     (2006.01)

(52) U.S. Cl.
    CPC ............... *H01L 2224/26125* (2013.01); *H01L 2224/29105* (2013.01); *H01L 2224/32245* (2013.01); *H01L 2224/83447* (2013.01)

(56) References Cited

U.S. PATENT DOCUMENTS

| | | | |
|---|---|---|---|
| 2005/0218508 A1* | 10/2005 | Fitzgerald | H01L 23/42 257/E23.087 |
| 2006/0113105 A1* | 6/2006 | Kubo | H01L 23/3675 257/E23.09 |
| 2008/0068803 A1* | 3/2008 | Chen | H01L 23/467 361/708 |
| 2008/0137300 A1* | 6/2008 | Macris | H01L 23/433 257/E23.09 |
| 2018/0374716 A1* | 12/2018 | Stathakis | H01L 21/56 |
| 2019/0221498 A1* | 7/2019 | Wu | H01L 23/433 |
| 2019/0373769 A1* | 12/2019 | Flowers | H05K 7/20154 |
| 2019/0393118 A1* | 12/2019 | Rawlings | H01L 24/29 |
| 2020/0350231 A1* | 11/2020 | Shen | H01L 23/4334 |
| 2021/0066160 A1* | 3/2021 | Lee | C09K 5/14 |
| 2022/0344237 A1* | 10/2022 | Deng | H01L 23/3736 |
| 2022/0375813 A1* | 11/2022 | Huang | H01L 23/42 |
| 2023/0413481 A1* | 12/2023 | Wang | H05K 7/2029 |

FOREIGN PATENT DOCUMENTS

| | | |
|---|---|---|
| JP | 2004-146819 A | 5/2004 |
| JP | 2004-311905 A | 11/2004 |
| JP | 2006-528434 A | 12/2006 |
| JP | 2009-290118 A | 12/2009 |

* cited by examiner

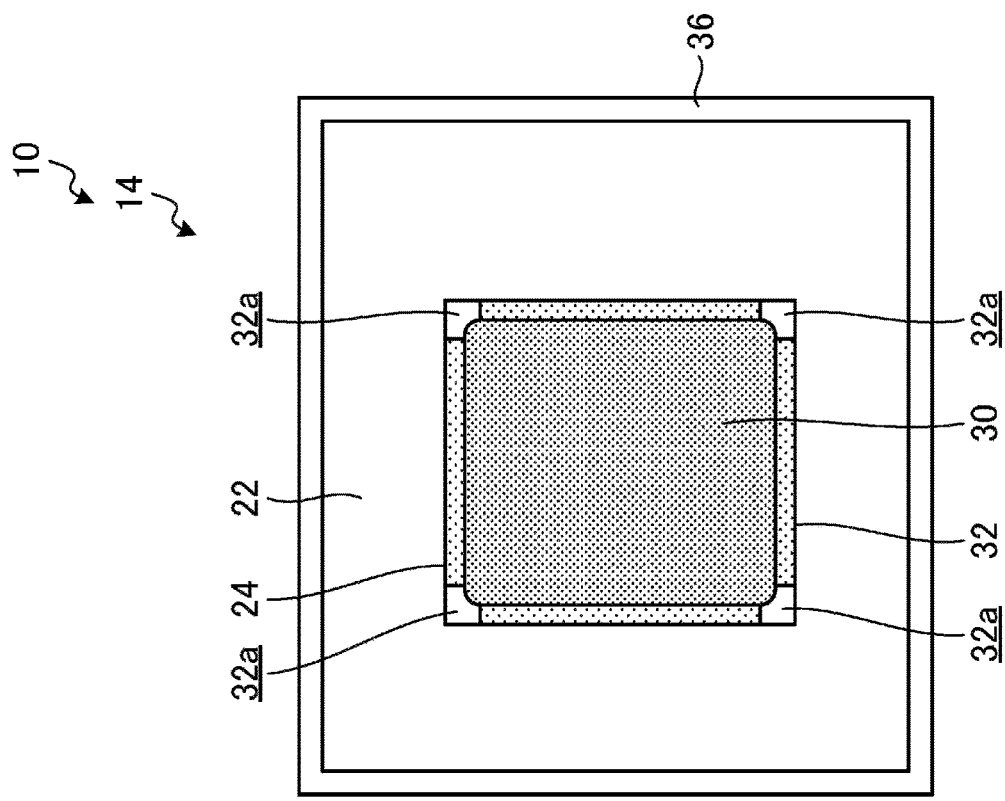
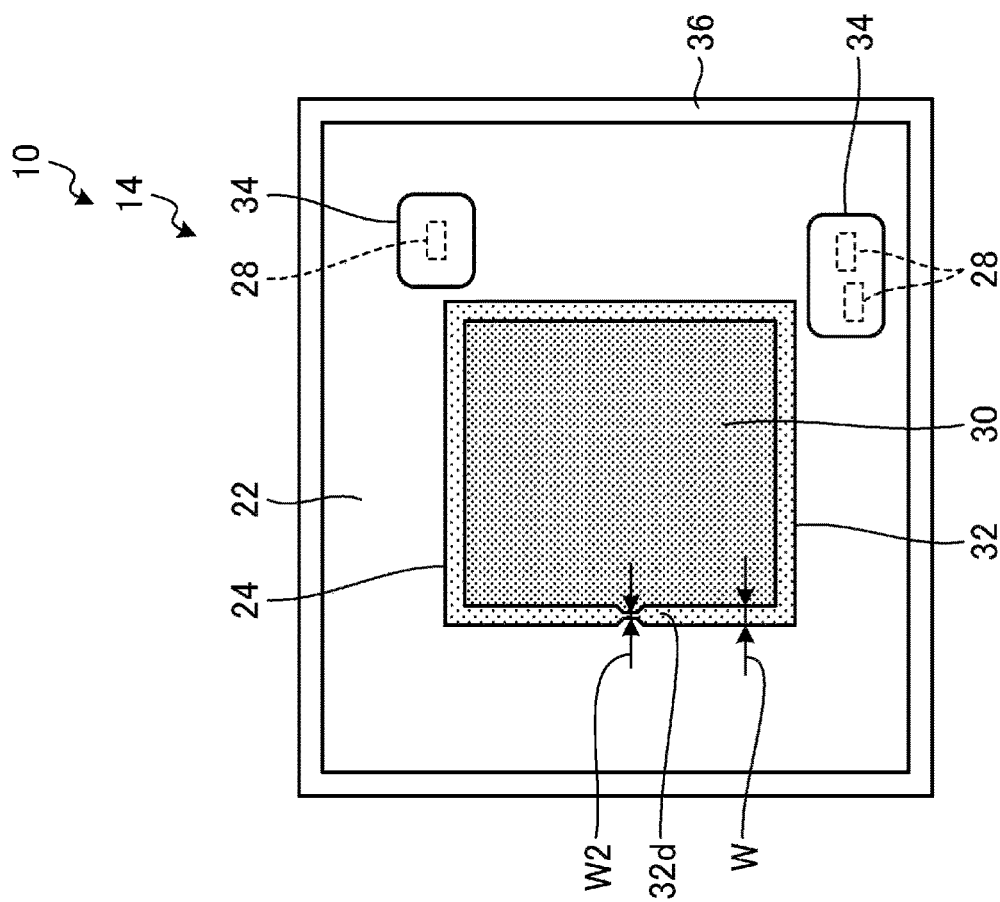

HEAT DISSIPATION STRUCTURE, MANUFACTURING METHOD FOR HEAT DISSIPATION STRUCTURE, AND ELECTRONIC APPARATUS

CROSS-REFERENCE TO RELATED APPLICATIONS

This application claims priority to Japanese Patent Application No. 2021-213311 filed on Dec. 27, 2021, the contents of which are hereby incorporated herein by reference in their entirety.

TECHNICAL FIELD

The present invention relates to a heat dissipation structure of an electric component that generates heat, a manufacturing method for the heat dissipation structure, and an electronic apparatus.

BACKGROUND

Portable information apparatuses such as laptop PCs include semiconductor chips such as GPUs and CPUs. A GPU or a CPU is shaped to have a substrate which is a part to be mounted on a board and a rectangular die provided on the surface of the substrate. Small capacitors may be provided around the die on the surface of the substrate.

A semiconductor chip such as a GPU or a CPU is a heating element, and requires heat dissipation depending on its power consumption (especially when highly loaded). As a means of dissipating heat from the GPU or CPU, a heat dissipator such as a vapor chamber, a heat spreader, or a heat sink may be used, and brought into contact with the surface of the die to diffuse heat. A fluid such as liquid metal or thermally conductive grease may be interposed between the die and the heat dissipator in order to efficiently transfer heat (for example, Japanese Unexamined Patent Application Publication No. 2004-146819).

Liquid metal has higher thermal conductivity than thermally conductive grease, and can effectively transfer heat from the die to the heat dissipator. Meanwhile, liquid metal has higher fluidity than thermally conductive grease. When an electronic apparatus is carrier and moved, the electronic apparatus is susceptible to vibration and impact. In such a case, there is a possibility that liquid metal which is fluid leaks out from the gap between the die and the heat dissipator due to repeated forces exerted from the die and the heat dissipator.

Even when the liquid metal leaks out from between the die and the heat dissipator, the liquid metal can be prevented from diffusing to the board by providing a wall body such as a sponge between the substrate and the heat dissipator. Moreover, the capacitors on the surface of the substrate can be protected from the liquid metal by covering them with an insulating material. It is therefore considered that leakage of a small amount of liquid metal from between the die and the heat dissipator does not cause problems.

The present inventor conducted an experiment to examine how much liquid metal interposed between the semiconductor chip and the heat dissipator leaks due to vibration and impact. FIG. 10 is a schematic cross-sectional view illustrating the state of this experiment. In the experiment, a CPU 500 including a substrate 502 and a die 504 was subjected to certain vibration and impact in a state in which liquid metal 508 was interposed between the surface 504a of the die 504 and a copper plate 506. It was observed in the experiment that more liquid metal 508 than expected leaked.

As a result of investigating the cause of this, it was found out that the surface 504a of the die 504, which had been assumed to be a flat surface, actually had a shape in which the central part is slightly raised relative to the peripheral part. This is probably due to the manufacturing process of the semiconductor chip. Thus, the gap between the die 504 and the copper plate 506 was relatively large in the peripheral part, and the liquid metal 508 tended to leak out. The same tendency was observed in a GPU.

A larger amount of the liquid metal 508 leaked is more likely to cause a decrease in heat conduction performance. In particular, there is a possibility that a void 510 is formed in the peripheral part of the die 504, and the heat conduction performance is likely to decrease due to an increase in heat resistance.

SUMMARY

One or more embodiments of the present invention provides a heat dissipation structure, a manufacturing method for a heat dissipation structure, and an electronic apparatus that can prevent leakage of liquid metal provided between an electric component that generates heat and a heat dissipator.

In one or more embodiments, a heat dissipation structure is a heat dissipation structure of an electric component that generates heat, the heat dissipation structure including: a heat dissipator provided along a surface of the electric component; a liquid metal interposed between the electric component and the heat dissipator; and a fencing body interposed between the electric component and the heat dissipator in a crushed state and surrounding the liquid metal. Thus, the leakage of the liquid metal provided between the electric component that generates heat and the heat dissipator can be prevented.

The fencing body may be a grease. The grease has higher viscosity than the liquid metal and resists leakage, and therefore can hold the liquid metal inside.

The heat dissipation structure may include: a board; and a semiconductor chip mounted on the board, the semiconductor chip may include a substrate and a die, and the electric component may be the die.

The fencing body may have an exhaust gap. Excess air inside can be discharged from the exhaust gap when pressing the heat dissipator.

One or more electric elements may be provided on the substrate, and the exhaust gap may be located in a range in which an angular interval of the one or more electric elements with respect to a center of the die is largest.

A surface of the die may have a shape in which a central part is raised relative to a peripheral part.

An electronic apparatus according to one or more embodiments of the present invention includes the heat dissipation structure described above.

A manufacturing method for a heat dissipation structure according to one or more embodiments of the present invention is a manufacturing method for a heat dissipation structure of an electric component that generates heat, the manufacturing method including: a grease application step of applying a grease to a peripheral part of a surface of the electric component; a liquid metal application step of applying a liquid metal to an area of the surface of the electric component surrounded by the grease; and a heat dissipator contact step of pressing a heat dissipator against the surface of the electric component to bring the liquid metal into contact with the heat dissipator while crushing the grease.

In the grease application step, an exhaust gap for discharging excess air in the heat dissipator contact step may be formed. The inside air can be discharged from the exhaust gap in the heat dissipator contact step.

In the liquid metal application step, the liquid metal may be applied with a gap between the liquid metal and the grease. Through this gap, the inside air can be easily guided to the exhaust gap.

In the grease application step, the grease may be applied using a silk screen. The silk screen allows the grease to be accurately applied to have a predetermined size.

According to the above-described aspects of the present invention, the fencing body is provided so as to surround the liquid metal, so that the liquid metal provided in the central part can be held and prevented from leakage even when vibration or impact is applied.

BRIEF DESCRIPTION OF THE DRAWINGS

FIG. 5A is a diagram illustrating a grease application form according to a first modification in accordance with one or more embodiments.

FIG. 5B is a diagram illustrating a grease application form according to a second modification in accordance with one or more embodiments.

DETAILED DESCRIPTION

A heat dissipation structure, a manufacturing method for a heat dissipation structure, and an electronic apparatus according to embodiments of the present invention will be described in detail below, with reference to drawings. Note that the present invention is not limited to these embodiments.

Figure 1:
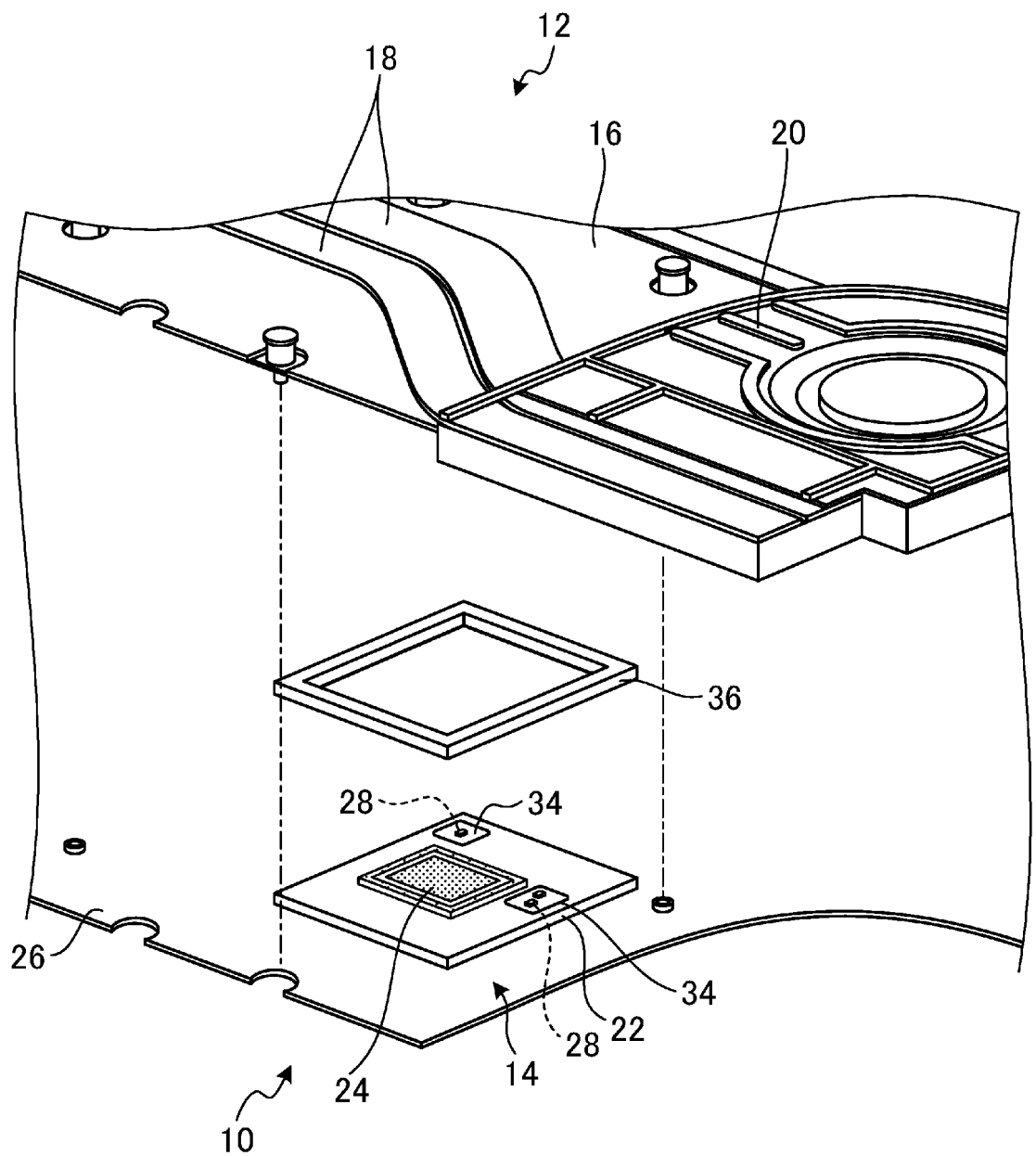
FIG. 1 is an exploded perspective view illustrating a heat dissipation structure and part of an electronic apparatus according to one or more embodiments of the present invention.

FIG. 1 is an exploded perspective view illustrating a heat dissipation structure 10 and part of an electronic apparatus according to one or more embodiments of the present invention.

A portable information apparatus (electronic apparatus) 12 is, for example, a laptop PC, a tablet terminal, or a smartphone, and includes a central processing unit (CPU) 14. The CPU (semiconductor chip) 14 performs high-speed computation and thus generates heat accordingly, so that heat dissipation is needed. The portable information apparatus 12 includes a vapor chamber 16 as a heat dissipation means for the CPU 14. The heat dissipation structure 10 is suitable for use in the portable information apparatus 12, but may also be used in an electronic apparatus such as a stationary desktop computer. The portable information apparatus 12 includes the vapor chamber (heat dissipator) 16 as a heat dissipation means for the CPU 14.

The vapor chamber 16 is a plate-shaped member obtained by joining the edges of two metal plates (e.g. copper plates) to form a closed space inside, and can diffuse heat with high efficiency by the phase change of a working fluid enclosed in the closed space. A wick that delivers the condensed working fluid by capillary action is located in the closed space of the vapor chamber 16.

Two substantially parallel heat pipes 18 are provided in the vapor chamber 16. The heat pipes 18 have their ends connected to a fan 20. Each heat pipe 18 is a thin flat metal pipe having a closed space formed inside, in which a working fluid is enclosed. A wick is located in the heat pipe 18, as in the vapor chamber 16.

The heat dissipation means for the heating element such as the CPU 14 is not limited to the vapor chamber 16, and various heat dissipators are applicable. Examples of heat dissipators include metal plates with high thermal conductivity such as copper and aluminum, graphite plates, heat lanes, and heat sinks.

Figure 2:
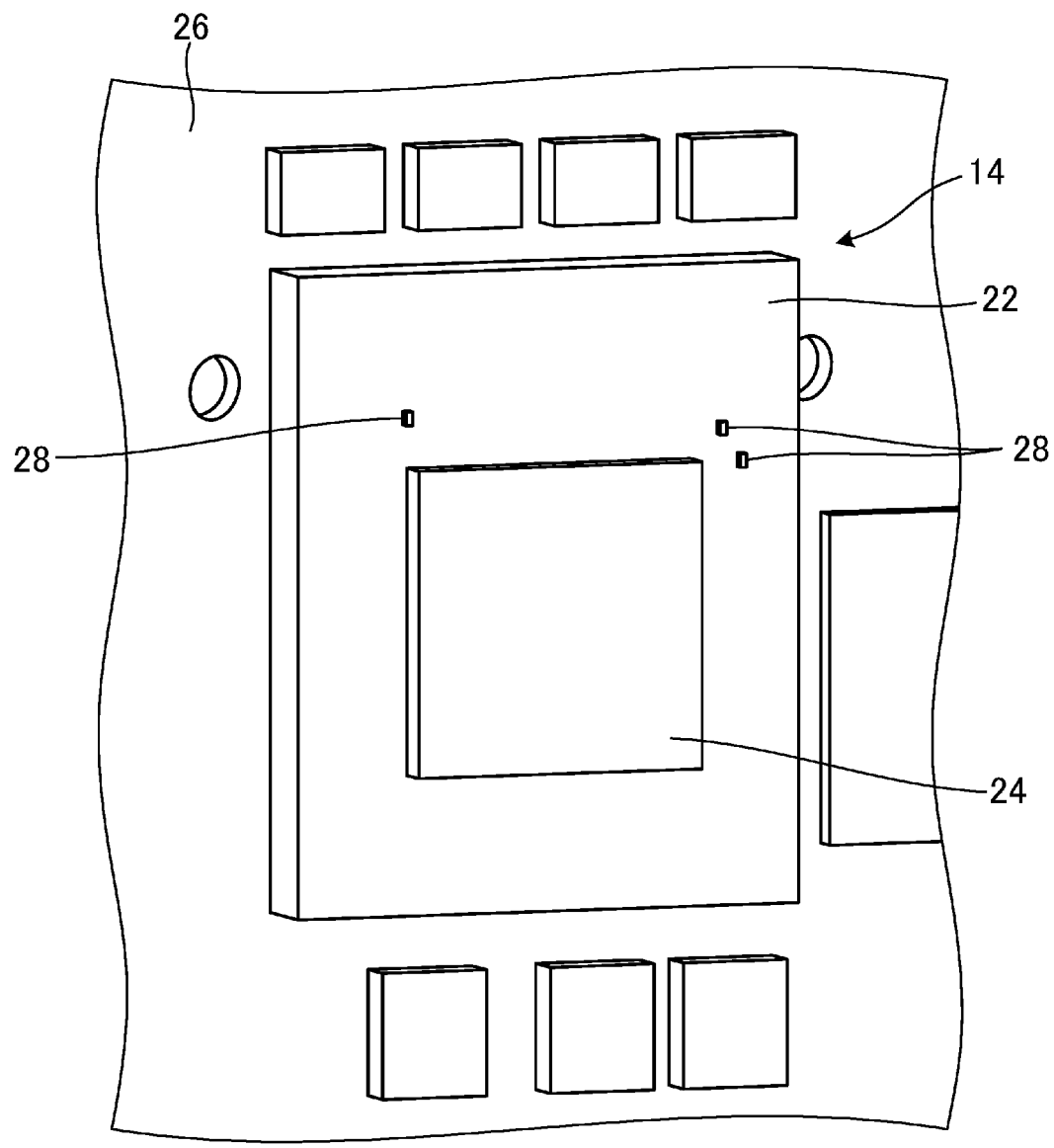
FIG. 2 is a perspective view of a CPU.

FIG. 2 is a perspective view of the CPU 14. The components of the heat dissipation structure 10 are omitted in FIG. 2. The CPU 14 includes a substrate 22 and a die (electric component) 24. The substrate 22 is a thin plate-shaped portion mounted on a board 26, and is rectangular in a plan view. The die 24 is a portion including an arithmetic circuit, and slightly protrudes from the top surface of the substrate 22. The die 24 has a rectangular shape smaller than that of the substrate 22 in a plan view, and is located approximately at the center of the top surface of the substrate 22. The CPU 14 is one of the components that generate the most heat in the portable information apparatus 12, and the die 24 in particular generates heat.

In other words, the die 24 is one of the electric components that generate the most heat in the portable information apparatus 12. The portable information apparatus 12 may include a graphics processing unit (GPU). The GPU includes a substrate and a die as in the CPU, and the heat dissipation structure 10 can be used for the GPU. The heat dissipation structure 10 can also be used for heat dissipation of a semiconductor chip other than the CPU 14 or the GPU or heat dissipation of any other electric component that generates heat.

A plurality of small capacitors (electric elements) 28 are provided on the surface of the substrate 22. Several capacitors 28 are located relatively close to the die 24. In the present invention, one or more capacitors 28 are provided on the surface of the substrate 22.

Figure 3:
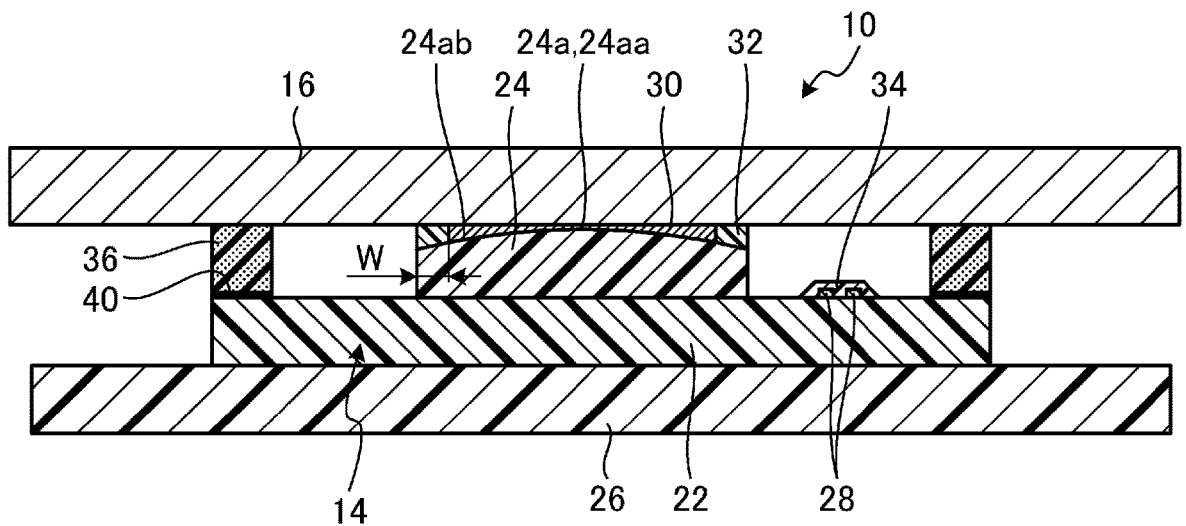
FIG. 3 is a schematic cross-sectional side view of the heat dissipation structure.

FIG. 3 is a schematic cross-sectional side view of the heat dissipation structure 10. The heat dissipation structure 10 includes the vapor chamber 16, a liquid metal 30 interposed between the surface 24a of the die 24 and the vapor chamber 16, a grease (fencing body) 32 interposed between the surface 24a and the vapor chamber 16 in a crushed state and surrounding the liquid metal 30, an insulating material 34 covering the capacitors 28, and an elastic material 36 provided between the substrate 22 and the vapor chamber 16. The vapor chamber 16 is thermally connected to the surface 24a of the die 24 via the liquid metal 30.

The surface 24a of the die 24 is commonly considered to be flat, but precise measurement reveals that a central part 24aa is slightly raised relative to a peripheral part 24ab in some cases, as mentioned earlier. The vapor chamber 16 is basically parallel to the surface 24a of the die 24, but may be non-parallel (approximately parallel) as long as it is in contact with the grease 32. Although not illustrated, a copper plate may be provided in the part of the vapor chamber 16 facing the CPU 14, and the vapor chamber 16 may be in contact with the liquid metal 30, the grease 32, and the elastic material 36 via the copper plate. In this case, the copper plate can be regarded as part of the vapor chamber 16 which is a heat dissipator.

The liquid metal 30 is basically a metal that is liquid at room temperature, but is liquid at temperatures in a normal use state in which the CPU 14 is in operation. The liquid metal 30 is metal, and therefore has excellent thermal conductivity and electrical conductivity. For example, the liquid metal 30 is mainly made of gallium.

The insulating material 34 is, for example, an ultraviolet curable coating material, and is formed in a film shape. The coating material is applied so as to cover the capacitors 28 and then irradiated with ultraviolet rays to cure and form the insulating material 34. The insulating material 34 can be easily formed using such an ultraviolet curable coating material. The insulating material 34 may be any other insulating adhesive or the like.

The elastic material 36 is provided on the peripheral part of the substrate 22 and protrudes upward. The elastic material 36 is a frame body, and coincides with the substrate 22 at the outer edges. The elastic material 36 is slightly higher than the die 24 in a natural state without external force, and is appropriately compressed by the vapor chamber 16 in an assembled state of the heat dissipation structure 10. The elastic material 36 is adhered and fixed to the surface of the substrate 22 by adhesive tape 40 of the same shape in a plan view. For example, the elastic material 36 is a sponge material. The elastic material 36 is a material that does not absorb the liquid metal 30.

The grease 32 is crushed by the die 24 and the vapor chamber 16 without leaving any gap (except the below-described exhaust gap 32a), and surrounds the liquid metal 30 so that the liquid metal 30 will not leak to the surroundings. Since the grease 32 has higher viscosity than the liquid metal 30, even when vibration or impact is applied, the grease 32 can be kept from leaking from between the die 24 and the vapor chamber 16 and can hold the liquid metal 30 provided in the central part to thus prevent the liquid metal from leaking.

As mentioned above, the surface 24a of the die 24 has the central part 24aa raised relative to the peripheral part 24ab in some cases. In such cases, the clearance between the surface 24a and the vapor chamber 16 is slightly large in the peripheral part 24ab. Accordingly, if the grease 32 is not provided, the liquid metal 30 is likely to leak into the surroundings when vibration or impact is applied. In one or more embodiments, however, the grease 32 having high viscosity closes the gap in a crushed state, so that the liquid metal 30 is prevented from leaking.

It is desirable that the width W of the grease 32 is moderately narrow so as to secure the area of the liquid metal 30 as wide as possible, and is also wide to such an extent that the leakage of the liquid metal 30 can be prevented even in the event of vibration or impact. Thus, it is desirable to apply the grease 32 with certain accuracy so that the width W of the grease 32 will be neither too narrow nor too wide. For example, the width W of the grease 32 is set to a constant width in the range of 1 mm to 2 mm.

The grease 32 may be thermally conductive so as to assist heat transfer by the liquid metal 30. An example of the thermally conductive grease 32 is 7783D manufactured by Shin-Etsu Chemical Co., Ltd. The thermally conductive grease 32 has a metal powder mixed therein to ensure thermal conductivity. However, since the metal powder is protected by the grease component, no special alteration occurs even in contact with the liquid metal 30. As the thermally conductive grease 32, liquid metal grease may be used. Depending on the type of the CPU 14, the heat distribution of the surface 24a may not be uniform and the peripheral part 24ab may be relatively low in temperature. In such a case, the grease 32 provided along the peripheral part 24ab may be inexpensive and non-thermally conductive grease.

Figure 4:
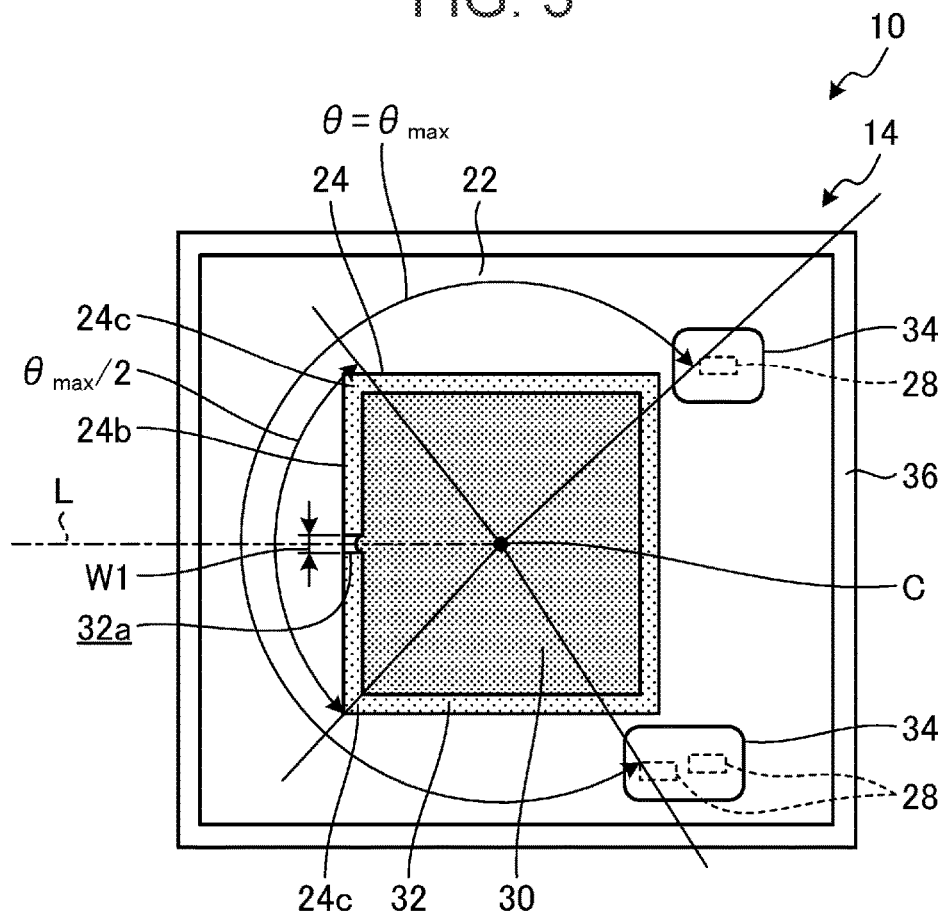
FIG. 4 is a schematic plan view of the heat dissipation structure.

FIG. 4 is a schematic plan view of the heat dissipation structure 10. In FIG. 4, the vapor chamber 16 is omitted, and the area of the liquid metal 30 is indicated by dark dots and the area of the grease 32 is indicated by light dots. As illustrated in FIG. 4, the grease 32 has one exhaust gap 32a that is open laterally. The exhaust gap 32a is used to discharge the air present in the area surrounded by the grease 32 in the process of the below-described manufacturing method for the heat dissipation structure 10.

It is desirable that the area of the exhaust gap 32a is wide enough to allow air which is gas to be discharged in the manufacturing process and narrow enough to prevent the liquid metal 30 which is liquid from leaking after the manufacture. That is, the width W of the exhaust gap 32a is set to be neither too narrow nor too wide, for example, 2 mm to 3 mm. A very small amount of excess liquid metal 30 on the surface 24a may be discharged from the exhaust gap 32a in the manufacturing process.

Even if the liquid metal 30 leaks out from the exhaust gap 32a during or after the manufacturing process, the amount of the liquid metal 30 leaked is limited to a very small amount. If the amount of the liquid metal 30 leaked is very small, the capacitors 28 on the substrate 22 are protected by the insulating material 34. If the amount of the liquid metal 30 leaked is very small, the leaked liquid metal 30 is contained within the range of the substrate 22 by the elastic material 36, and thus is kept from diffusing to the board 26.

The exhaust gap 32a is located in the range in which the angular interval θ of the capacitors 28 with respect to the center C of the die 24 is largest, i.e. the maximum interval $θ_{max}$. Hence, the exhaust gap 32a is appropriately separated from at least one of the capacitors 28, with it being possible to further protect the capacitors 28 from the liquid metal 30. If one capacitor 28 is provided on the substrate 22, the part except the width of the capacitor 28 is the maximum interval $θ_{max}$.

The exhaust gap 32a may be located in the range of ½ of the maximum interval $θ_{max}$, i.e. $θ_{max}/2$, the center line of which is the same as the line L that is the center line of the maximum interval $θ_{max}$. Thus, the exhaust gap 32a is appropriately separated from each capacitor 28 in a balanced manner. The exhaust gap 32a may be provided at any part of a remote edge 24b of the rectangular die 24. The remote edge 24b is an edge between corners 24c that are far from each of the two capacitors 28 located at both ends of the maximum distance $θ_{max}$. In other words, the remote edge 24b is the edge where the line L is present among the four edges. Even if the liquid metal 30 leaks out from the exhaust gap 32a formed at the remote edge 24b, the corners 24c of the die 24 act like a wall to prevent the liquid metal 30 from further flowing around. For example in the case where the manufacturing process of the heat dissipation structure 10 is performed in a vacuum, the exhaust gap 32a may be omitted.

FIGS. 5A and 5B are each a diagram illustrating a form of applying the grease 32 according to a modification. FIG. 5A is a diagram illustrating a first modification in which a constricted portion 32d is formed at the location of the exhaust gap 32a in the foregoing example. The width W2 of the constricted portion 32d is narrower than the width W of the other parts of the grease 32. The constricted portion 32d is formed as follows: A part that has been open as with the exhaust gap 32a in the manufacturing process is filled as a result of pressing the vapor chamber 16 to crush the grease 32 and spread it from both sides. Such a constricted portion 32d allows the inside air to be discharged in the manufacturing process, and allows the inside liquid metal 30 to be enclosed more reliably after the manufacture.

FIG. 5B is a diagram illustrating a second modification in which a plurality of exhaust gaps 32a are formed. In this case, the exhaust gaps 32a are formed at the four corners of the die 24. The exhaust gaps 32a are arranged at regular intervals in one or more embodiments. By providing a plurality of exhaust gaps 32a in this way, the inside air can be discharged more easily in the manufacturing process. Part or all of the plurality of exhaust gaps 32a may be filled after the manufacture to form a constricted portion 32d, as illustrated in FIG. 5A.

Figure 6:
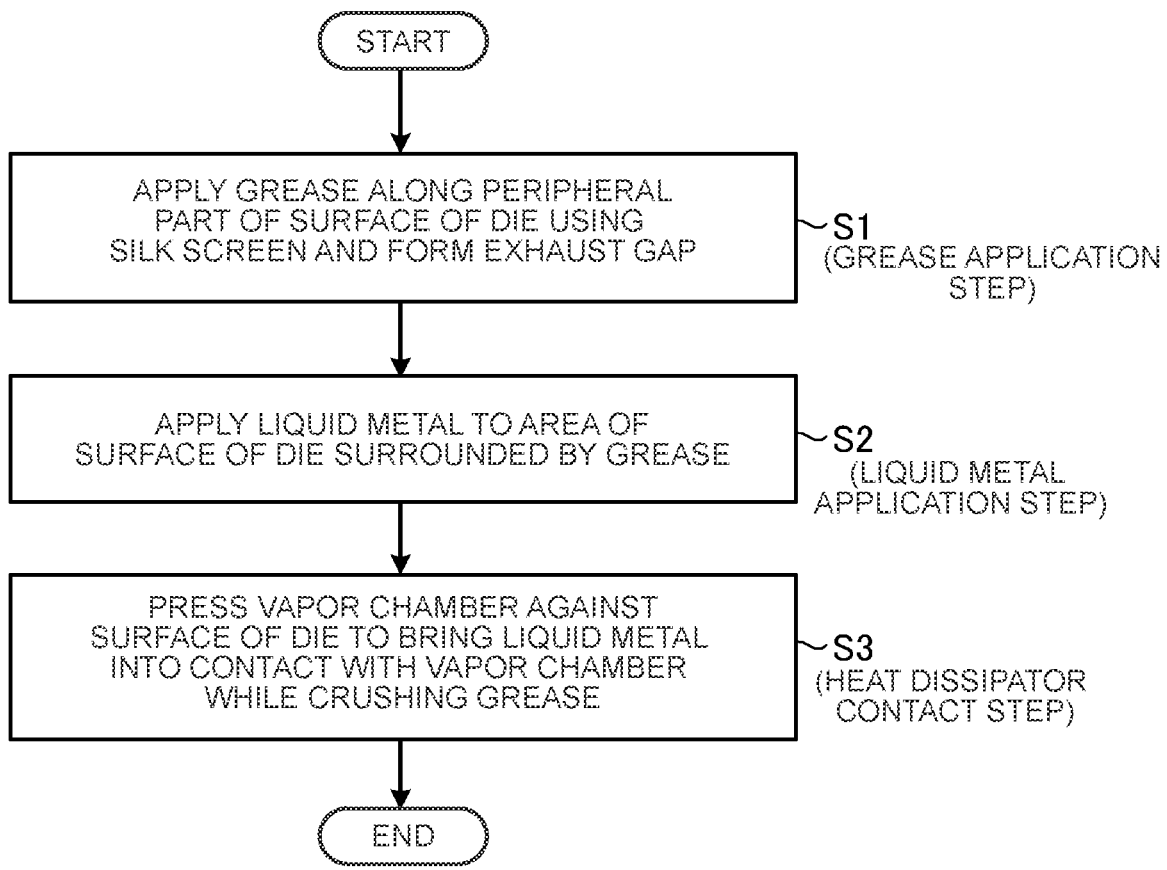
FIG. 6 is a flowchart illustrating a manufacturing method for a heat dissipation structure according to one or more embodiments.
Figure 7:
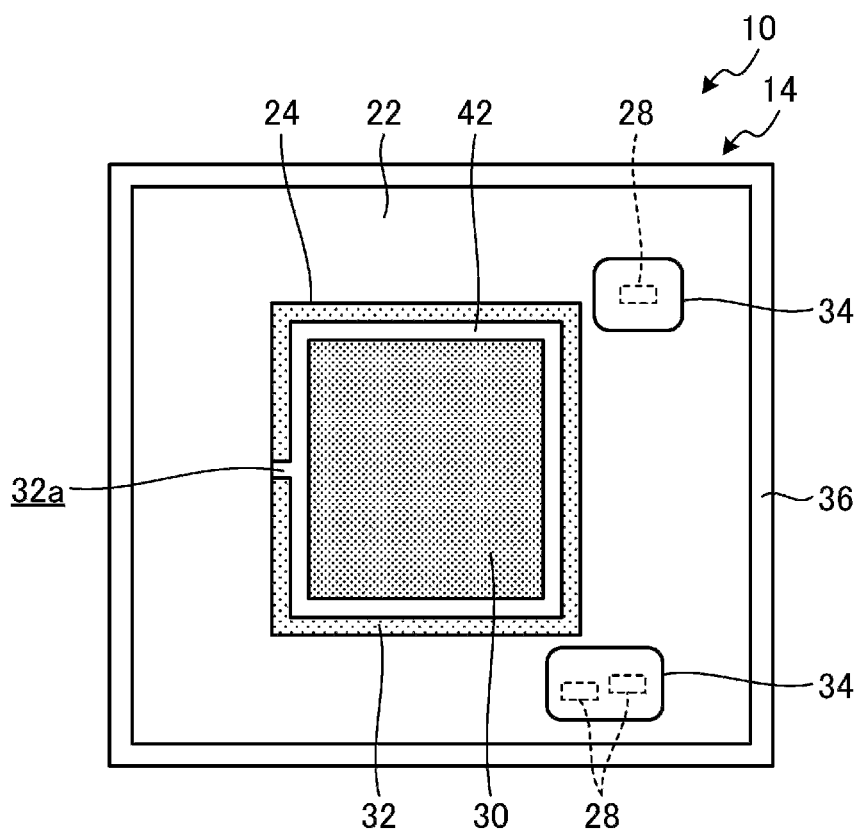
FIG. 7 is a schematic plan view illustrating a state in which grease and liquid metal are applied to a die.
Figure 8:
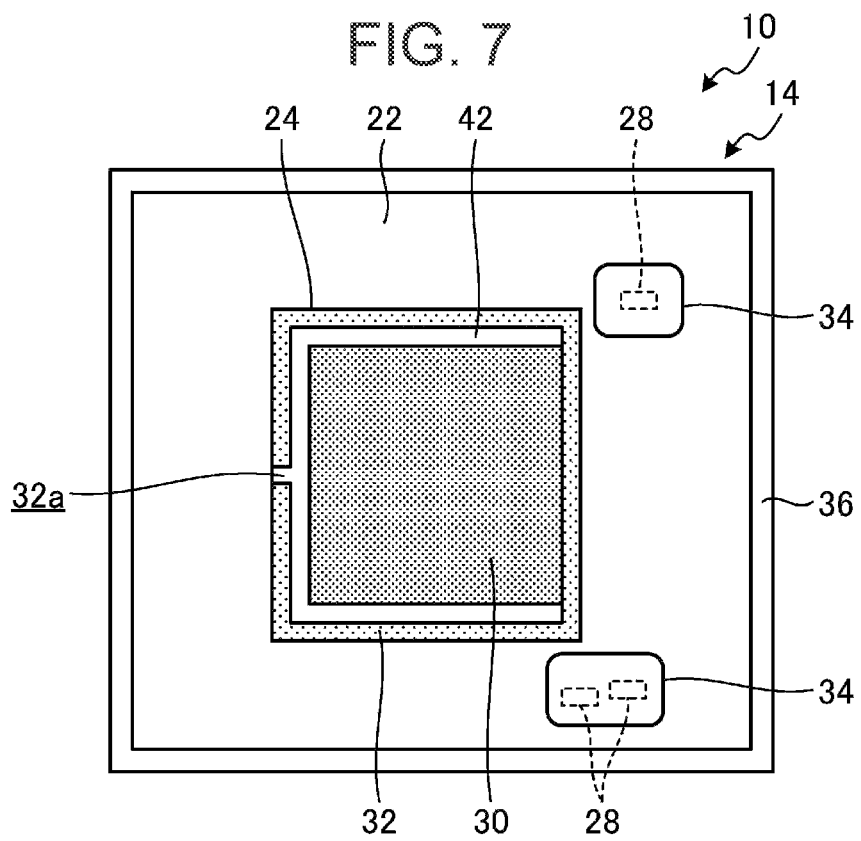
FIG. 8 is a schematic plan view illustrating a state in which grease and liquid metal are applied to a die according to a modification in accordance with one or more embodiments.
Figure 9:
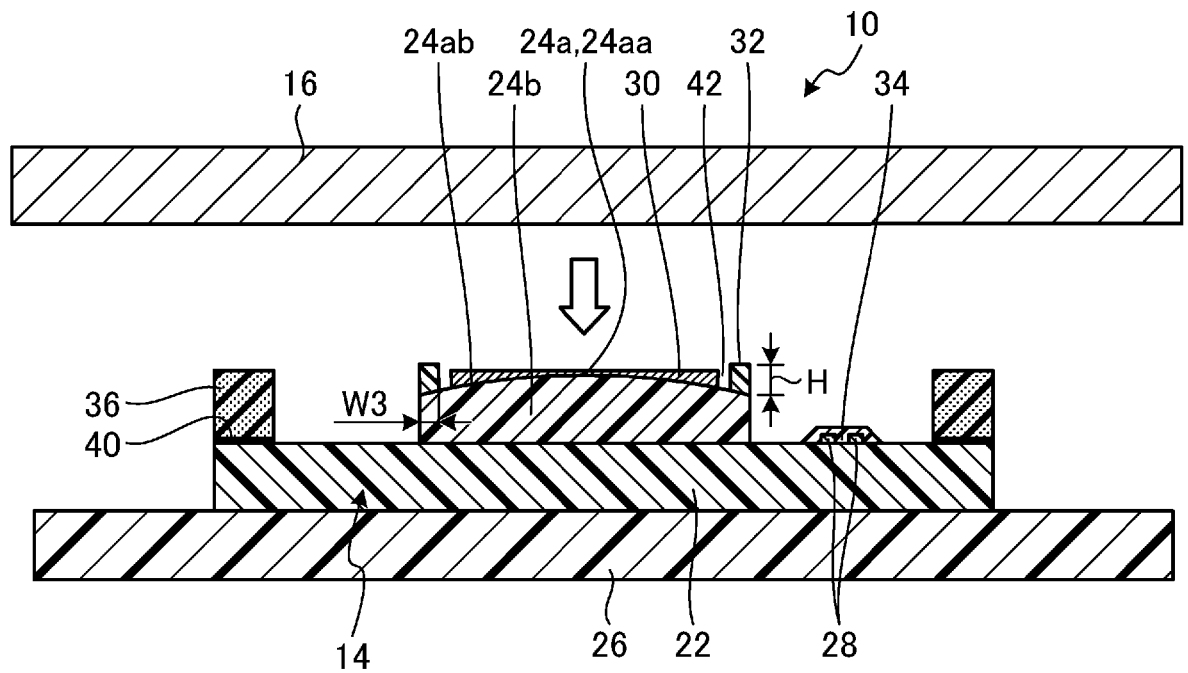
FIG. 9 is a schematic cross-sectional side view illustrating a heat dissipator contact step.
Figure 10:
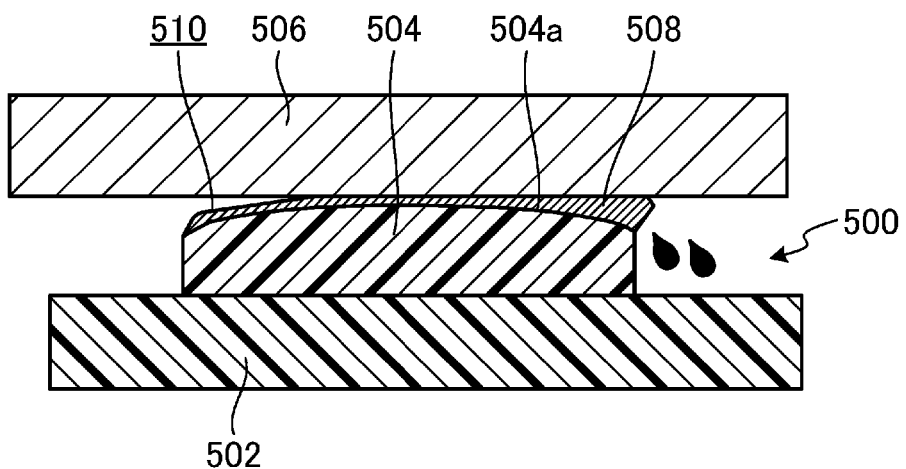
FIG. 10 is a schematic cross-sectional side view of a heat dissipation structure according to a conventional technique.

A manufacturing method for the heat dissipation structure 10 will be described below. FIG. 6 is a flowchart illustrating the manufacturing method for the heat dissipation structure 10. FIG. 7 is a schematic plan view illustrating a state in which the grease 32 and the liquid metal 30 are applied to the die 24. FIG. 8 is a schematic plan view illustrating a state in which the grease 32 and the liquid metal 30 are applied to the die 24 according to a modification. FIG. 9 is a schematic cross-sectional side view illustrating a heat dissipator contact step. In the manufacturing method for the heat dissipation structure 10, it is assumed that the CPU 14 is mounted on the board 26 prior to the process illustrated in FIG. 6. The board 26 may be in a state of being assembled to a chassis of the portable information apparatus 12, or in a state before the assembly.

In step S1 (grease application step) in FIG. 6, the grease 32 is applied along the peripheral part 24ab of the surface 24a of the die 24. In step S1, the exhaust gap 32a is formed as described above. The height H of the grease 32 at this point (see FIG. 9) is desirably low in order to reduce heat resistance, but is higher than the central part 24aa in order to ensure that the grease 32 comes into contact with the vapor chamber 16. Accordingly, the height H of the grease 32 is desirably about 0.2 mm to 0.25 mm, for example. The width W3 of the grease 32 at this point is slightly narrower than the width W after the manufacture (see FIG. 3).

In this step, the grease 32 is applied using a silk screen. The silk screen allows automated or semi-automated application, and allows the grease 32 to be applied along the edges of the die 24 with a constant proper width and proper thickness. The silk screen also allows the exhaust gap 32a to be set to a proper width without variation.

Although it is also possible to apply the grease 32 to the corresponding part of the vapor chamber 16 instead of the die 24, accurately aligning the grease 32 with the peripheral part 24ab of the die 24 is difficult, and whether the grease 32 lies along the peripheral part 24ab of the die 24 cannot be checked after the assembly. Therefore, the grease 32 may be applied to the die 24 in one or more embodiments.

In step S2 (liquid metal application step), an appropriate amount of the liquid metal 30 is applied to the area of the surface 24a of the die 24 surrounded by the grease 32, as illustrated in FIG. 7. This step is performed manually by an operator or performed by a predetermined automatic machine.

In this step, the liquid metal 30 is applied so as to form a gap 42 with the grease 32. The gap 42 is formed around the liquid metal 30 on all four sides. Thus, an overlap of the liquid metal 30 and the grease 32 is suppressed, and the grease 32 with the proper width comes into contact with the vapor chamber 16.

In this step, the gap 42 may be formed on three sides as seen from the liquid metal 30, as illustrated in FIG. 8. The side on which the gap 42 is not formed is the side (the right in FIG. 8) opposite to the exhaust gap 32a. This makes it easier for the air in the gap 42 to escape through the exhaust gap 32a in the next step S3.

In step S3 (heat dissipator contact step), the vapor chamber 16 is pressed against the surface 24a of the die 24, as illustrated in FIG. 9. As a result, the grease 32 is crushed between the vapor chamber 16 and the surface 24a to eliminate the gap therebetween, and thus the liquid metal 30 can be held inside. The liquid metal 30 spreads as a result of being in contact with the vapor chamber 16, and thermally connects the surface 24a and the vapor chamber 16 in substantially the whole region surrounded by the grease 32. Moreover, the air present in the gap 42 is exhausted from the exhaust gap 32a. A very small amount of excess liquid metal 30 may be discharged from the exhaust gap 32a, as mentioned above.

Such a heat dissipation structure 10 and manufacturing method therefor are suitably used to prevent the leakage of the liquid metal 30 in the case where the central part 24aa of the die 24 is raised relative to the peripheral portion 24ab of the die 24, but are also applicable to the case where the surface 24a of the die 24 is flat to achieve the leakage prevention effect. The fencing body for preventing the leakage of the liquid metal 30 is not limited to the grease 32, and may be any material that can be crushed by the surface 24a and the vapor chamber 16, for example, an elastic body such as a thin sponge.

The present invention is not limited to the embodiments described above, and changes can be made freely without departing from the gist of the present invention.

DESCRIPTION OF SYMBOLS 10 heat dissipation structure
12 portable information apparatus (electronic apparatus)
16 vapor chamber (heat dissipator)
22 substrate
24 die
24b remote edge
24aa central part
24a surface
26 board
28 capacitor (electric element)
30 liquid metal
32 grease (fencing body)
32a exhaust gap
34 insulating material
36 elastic material
$\theta$ angular interval
$\theta_{max}$ maximum interval

What is claimed is:
1. A heat dissipation structure of an electric component that generates heat, the heat dissipation structure comprising:

a semiconductor chip that includes a substrate, a die disposed on a surface of the substrate, and one or more electric elements disposed on the surface of the substrate, where the electric component is the die;

a heat dissipator provided along a surface of the electric component;

a liquid metal interposed between the electric component and the heat dissipator; and a fencing body interposed between the electric component and the heat dissipator in a crushed state and surrounding the liquid metal, wherein the fencing body has an exhaust gap that is open laterally along a plane parallel to the surface of the substrate, wherein the exhaust gap is located in an angular range that is half of a maximum angular interval of the one or more electric elements with respect to a center of the die along the plane parallel to the surface of the substrate.

2. The heat dissipation structure according to claim 1, wherein the fencing body is a grease.

3. The heat dissipation structure according to claim 1, further comprising:

a board, wherein the semiconductor chip is mounted on the board.

4. The heat dissipation structure according to claim 1, wherein a surface of the die has a shape in which a central part is raised relative to a peripheral part.

5. An electronic apparatus comprising the heat dissipation structure according to claim 1.

6. A manufacturing method for a heat dissipation structure of an electric component that generates heat, the manufacturing method comprising:

a grease application step of applying a grease to a peripheral part of a surface of the electric component, where a semiconductor chip includes a substrate and a die and the electric component is the die, and the grease includes an exhaust gap on the surface of the electric component that is open laterally;

a liquid metal application step of applying a liquid metal to an area of the surface of the electric component surrounded by the grease; and a heat dissipator contact step of pressing a heat dissipator against the surface of the electric component to bring the liquid metal into contact with the heat dissipator while crushing the grease, where excess air is discharged through the exhaust gap during the heat dissipator contact step, wherein one or more electric elements are provided on the substrate, and wherein the exhaust gap is located in a range in which an angular interval of the one or more electric elements with respect to a center of the die is largest.

7. The manufacturing method for the heat dissipation structure according to claim 6, wherein in the liquid metal application step, the liquid metal is applied with a gap between the liquid metal and the grease.

8. The manufacturing method for the heat dissipation structure according to claim 6, wherein in the grease application step, the grease is applied using a silk screen.

9. The manufacturing method for the heat dissipation structure according to claim 6, wherein in the heat dissipater contact step, the grease is crushed to form a constricted portion in the gap that has a narrower width than the remainder of the grease.

* * * * *